United States Patent [19]

Mojaradi et al.

[11] Patent Number: 5,321,293

[45] Date of Patent: Jun. 14, 1994

[54] INTEGRATED DEVICE HAVING MOS TRANSISTORS WHICH ENABLE POSITIVE AND NEGATIVE VOLTAGE SWINGS

[75] Inventors: Mohamad M. Mojaradi, Los Angeles; Tuan Vo, Hawthorne; Jaime Lerma, Oxnard; Steven A. Buhler, Redondo Beach, all of Calif.

[73] Assignee: Xerox Corporation, Stamford, Conn.

[21] Appl. No.: 88,945

[22] Filed: Jul. 12, 1993

[51] Int. Cl.[5] .......................... H01L 27/02; H03K 3/01
[52] U.S. Cl. .................................... 257/369; 257/546; 257/357; 307/296.2
[58] Field of Search .................. 257/369, 546, 357; 307/296.2

[56] References Cited

U.S. PATENT DOCUMENTS 5,124,778 6/1992 Adachi .............................. 257/369
5,182,469 1/1993 Farley et al. ...................... 307/296.2

Primary Examiner—Mark V. Prenty
Attorney, Agent, or Firm—Fariba Rad

[57] ABSTRACT

A semiconductor circuit integrated with CMOS circuits for receiving a TTL input voltage and generating a large negative and positive voltage swing with respect to p-type or n-type substrate is disclosed. This invention is based on elimination of the electro-static discharge (ESD) protection circuit which is a requirement for any integrated circuit. Eliminating the ESD protection circuit also eliminates the clamping feature of the ESD protection circuit and therefore the circuit can be driven to negative voltages for PMOS circuits and to positive voltages for NMOS circuits. This provides the possibility of connecting the drain of a a P-channel type metal oxide silicon field effect (PMOS) transistor, which is fabricated on a p-type substrate within an n-well, to a voltage below the the substrate voltage. Also, in a n-channel type metal oxide silicon field effect (NMOS) transistor which is fabricated on a n-type substrate within a P-well, the drain can be connected to voltages higher than the substrate voltage. Utilizing this feature of a MOS transistor provides a way to design an integrated circuit which can handle negative voltage swings as well as positive voltage swings.

4 Claims, 10 Drawing Sheets

INTEGRATED DEVICE HAVING MOS TRANSISTORS WHICH ENABLE POSITIVE AND NEGATIVE VOLTAGE SWINGS

It is an object of this invention to provide a technique for realizing large negative and positive voltage swings with respect to p-type and n-type substrates by utilizing metal oxide silicon field-effect (MOSFET) transistors integrated with complementary-symmetry metal oxide silicon field-effect (CMOS) circuits. This invention is capable of generating voltage swings as low as −60 V and as high as +60 V. This invention can utilize p-channel MOSFET (PMOS) transistors or n-channel type MOSFET (NMOS) transistors to provide a design for a negative and positive voltage swing circuit. Also, this invention eliminates the need for using bulky discrete elements used in the design of the prior art negative voltage swing circuits.

BRIEF DESCRIPTION OF THE DRAWINGS

Other objects will become apparent from the following description with reference to the drawings wherein.

SUMMARY OF THE INVENTION

It is an object of this invention to provide a way to design a circuit for generating large negative and positive voltage swings with respect to p-type and n-type substrates. It is also an object of this invention to integrate the negative and positive voltage swing circuit of this invention with CMOS circuits and therefore eliminate the need for the discrete elements used in the negative voltage swing circuits. This invention is based on elimination of the output electro-static discharge (ESD) protection circuit which has been a commonly accepted requirement for any integrated circuit. Eliminating the ESD protection circuit also eliminates the clamping feature of the ESD protection circuit and therefore the output of the integrated circuit can be connected to negative voltages. This permits the use of an on chip integrated circuit to generate a negative voltage swing.

DESCRIPTION OF THE PREFERRED EMBODIMENT

Figure 1:
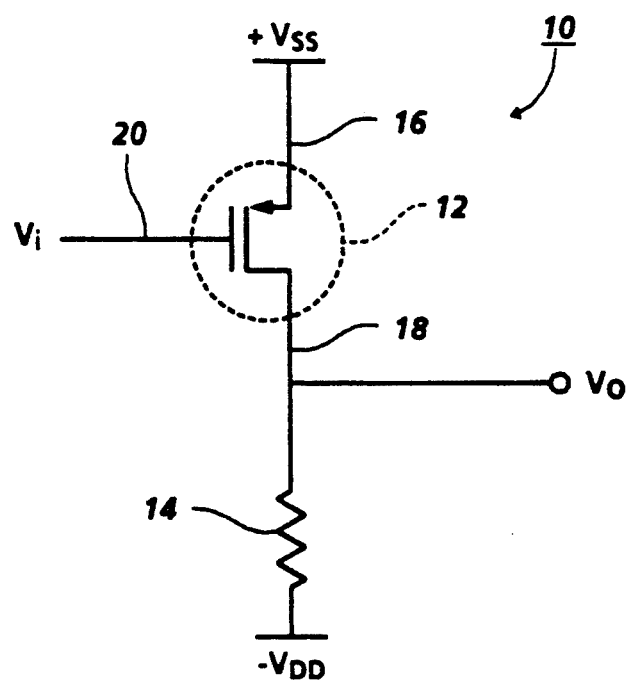
FIG. 1 shows a circuit diagram of a prior RS232 driver made with a discrete resistor.

Typically a negative voltage swing circuit is made with discrete components. Referring to FIG. 1, there is shown a circuit diagram of a prior art RS232 driver 10 which is capable of providing a negative voltage swing. This circuit is made of a discrete PMOS transistor 12 and a discrete resistor 14. In this circuit the source 16 of the PMOS transistor 12 is connected to a positive voltage $+V_{SS}$, the drain 18 is connected to a negative voltage $-V_{DD}$ through the resistor 14 and the gate 20 is connected to an input voltage $V_i$ which swings between 0 to +5 V. The output voltage $V_o$ is the voltage of the drain 18 of the PMOS transistor 12.

Figure 2:
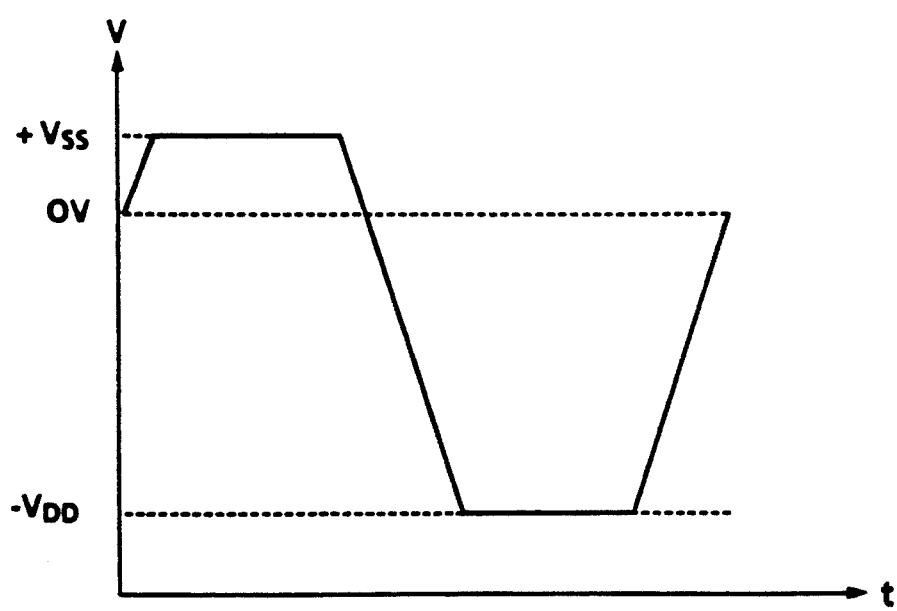
FIG. 2 shows a curve of a prior art voltage swing between a positive voltage and a negative voltage.

In operation, when the input voltage $V_i$ is in the neighborhood of the ground potential, the PMOS transistor 12 is ON. When the PMOS transistor 12 is ON, the output voltage approximately becomes $+V_{SS}$. However, when the input voltage $V_i$ is at +5 V, the PMOS transistor 12 is OFF and as a result, the output voltage drops to a voltage close to $-V_{DD}$. Therefore, the output voltage $V_o$ of this circuit swings approximately between $+V_{SS}$ and $-V_{DD}$. Referring to FIG. 2, there is shown an example of a voltage swing between $+V_{SS}$ and $-V_{DD}$. The horizontal axis represents time and the vertical axis represents voltage.

Usually, the circuit shown in FIG. 1 does not require an electro-static discharge (ESD) protection circuit since a discrete transistor is large enough to withstand an ESD shock. However, if the same circuit 10 is built in an integrated circuit, due to the commonly accepted practice of designing elements of an integrated circuit with the smallest layout area, an output ESD protection circuit is required on the output transistor to prevent the transistor from destruction. It should be noted that an output transistor is a transistor that is connected to elements outside of the integrated circuit and it is the output transistor that requires an ESD protection. An output ESD protection circuit clamps down any negative voltages applied to the circuit. Therefore, due to the clamping feature of the output ESD protection, it has been a commonly accepted principle that an integrated circuit can not be used to generate a negative voltage swing.

This invention ignores the commonly accepted principle that integrated circuits cannot be used to generate negative voltages by going contrary to the commonly accepted practice of designing elements of an integrated circuit with the smallest area and increasing the layout area of a transistor to handle an ESD shock and therefore eliminate the previously required ESD protection circuit. This change permits an output transistor to withstand an ESD shock without an ESD protection circuit and also permits an integrated circuit to be used for negative voltage swing applications. It should be noted that the size of the transistor depends on many different factors such current, sourcing/sinking, speed of response, etc.

In order to apprehend this invention, it is necessary to study the structure of an integrated MOS transistor fabricated with complementary-symmetry (CMOS) circuits in a single tub bulk CMOS technology.

Figure 3:
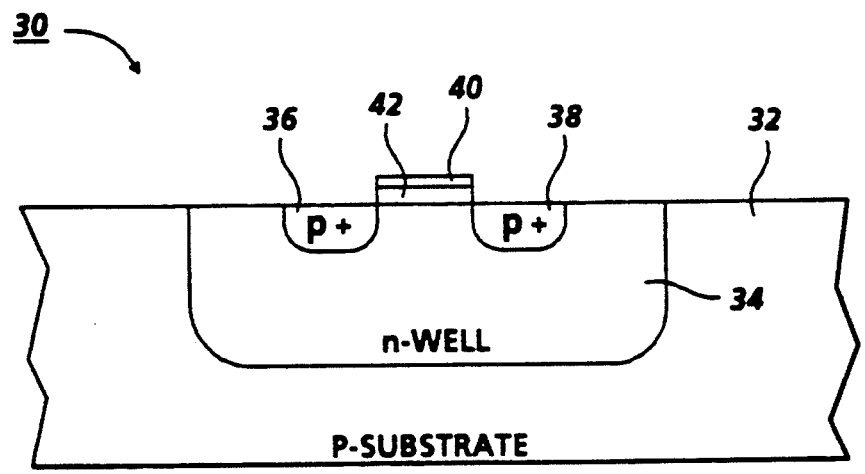
FIG. 3 shows a structure of a prior art p-channel metal oxide silicon field effect transistor (PMOS) fabricated on a p-substrate.

Referring to FIG. 3, there is shown a structure of a p-channel type metal oxide silicon field effect transistor (PMOS) 30 fabricated on a p-type substrate 32. The PMOS transistor on a p-type substrate consists of a n-type well or tub 34, two p+ regions within the n-well 34 to function as the source 36 and the drain 38 of the transistor. A metal/poly gate 40 is located above the n-well 34. However, the gate 40 is insulated from the n-well 34 by a layer 42 such as silicon dioxide.

Typically, in a structure such as PMOS transistor 30, the p-substrate 32 is connected to the most negative voltage on the chip which is the ground potential, the n-well 34 is connected to the source voltage or to the most positive voltage on the chip, i.e. +5 V, and finally the gate 40 is connected to a positive voltage in the range of 0 V to +5 V. Usually, if the transistor 30 is an output transistor an ESD protection circuit is required to protect the transistor from the ESD shocks. A conventional output ESD protection circuit comprises a n+ diode which typically is placed between the drain and the substrate. The n+ diode forward biases when the voltage of the drain is 0.7 V below the substrate. In the past, due to the clamping feature of the ESD protection circuits, it has been common knowledge that the drain 38 can not be connected to voltages lower than the voltage of the p-substrate 32 which is the ground potential.

However, by eliminating the ESD protection circuit, the drain 38 can in fact be connected to negative voltages (below the substrate voltage which is at the ground potential) as long as the difference between the drain voltage and the ground potential is kept below the breakdown voltage of the transistor. When the n-well 34 is connected to a positive voltage $+V_n$, the drain 38 can be connected to a negative voltage $-V_{DD}$ as long as the difference between the voltage of the n-well and the drain voltage is kept below the breakdown voltage $[V_{BR}>(+V_n)-(-V_{DD})]$.

Being able to connect the drain of a PMOS transistor to negative voltages (below the substrate voltage), provides a way to achieve negative voltage swings which is a desirable feature that can be utilized in many different applications such as drivers for RS232 interface, phase array radar drivers and power normal circuits.

It should be noted that the same applies to an NMOS in a n-type substrate only with opposite polarities. Meaning that in an integrated circuit with a n-type substrate, if the ESD protection is eliminated, the drain of a NMOS transistor can be connected to voltages above the substrate voltage.

Figure 4:
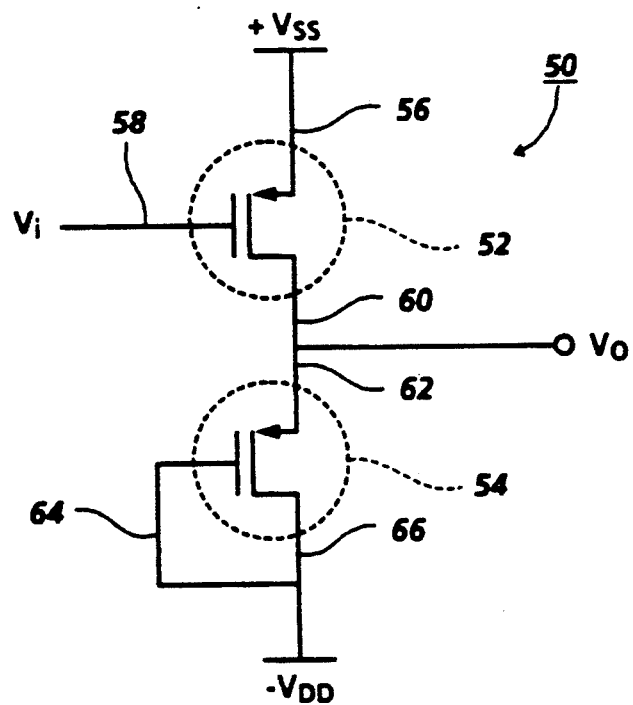
FIG. 4 shows an integrated circuit diagram of a RS232 driver of this invention utilizing two PMOS transistors.

Referring to FIG. 4, there is shown a PMOS negative and positive voltage swing circuit 50 which can be integrated with CMOS circuits. In this invention the discrete transistor 12 (FIG. 1) and the discrete resistor 14 (FIG. 1) are replaced by two PMOS transistors 52 and 54. In this circuit the source 56 of the PMOS transistor 52 is connected to a positive voltage $+V_{SS}$, the gate 58 of the PMOS transistor 52 is connected to the input voltage $V_i$ and the drain 60 of the PMOS transistor 52 is connected to the source 62 of the PMOS transistor 54. In order to have the transistor 54 function as an active resistor, its gate 64 is connected to its drain 66 and the drain 66 is connected to a negative voltage $-V_{DD}$. By connecting the gate 64 of the PMOS transistor 54 to its drain 66, the PMOS transistor 54 acts as an active resistor.

Figure 5:
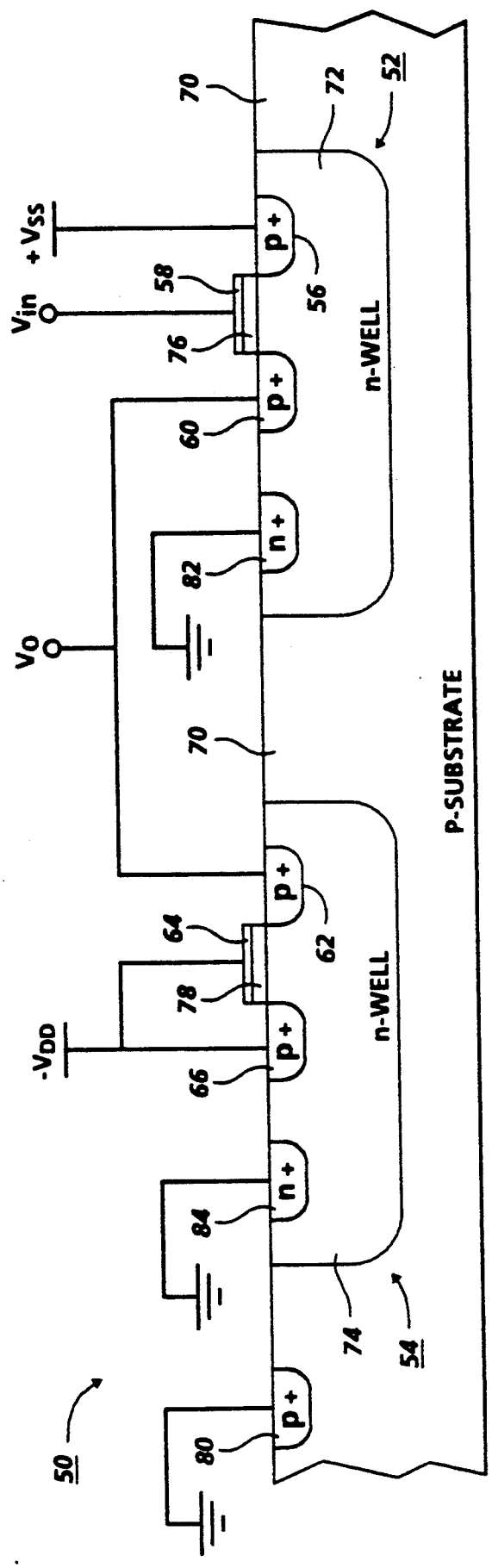
FIG. 5 shows the structure of the circuit of FIG. 4 utilizing two low voltage transistors.

Referring to FIG. 5, there is shown a structure of the circuit 50 of FIG. 4 utilizing two low voltage PMOS transistors. The two p+ regions 56 and 60 of the PMOS transistor 52 and the two p+ regions 66 and 62 of the PMOS transistor 54 are diffused into n-wells 72 and 74 respectively to generate the sources 56 and 62 and the drains 60 and 66. Metal/poly gates 58 and 64 are insulated from the n-wells by two layers of silicon dioxide 76 and 78 respectively. The substrate 70 is connected to the ground potential through the P+ region 80. It should be noted that the n-well 72 of PMOS transistor 52 and the n-well 74 of PMOS transistor 54 have to be connected to the same potential or both transistors 52 and 54 have to be in the same n-well. The n-well 72 and the n-well 74 are connected to the most positive voltage through the n+ regions 82 and 84 respectively.

Figure 6:
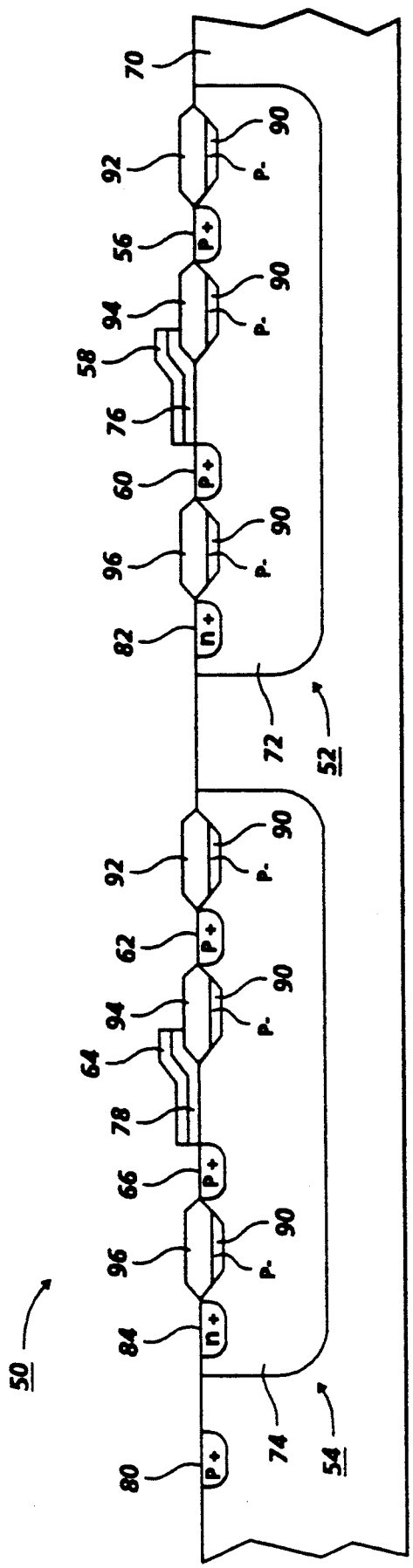
FIG. 6 shows the structure of the circuit of FIG. 4 utilizing two high voltage transistors.
Figure 6A:
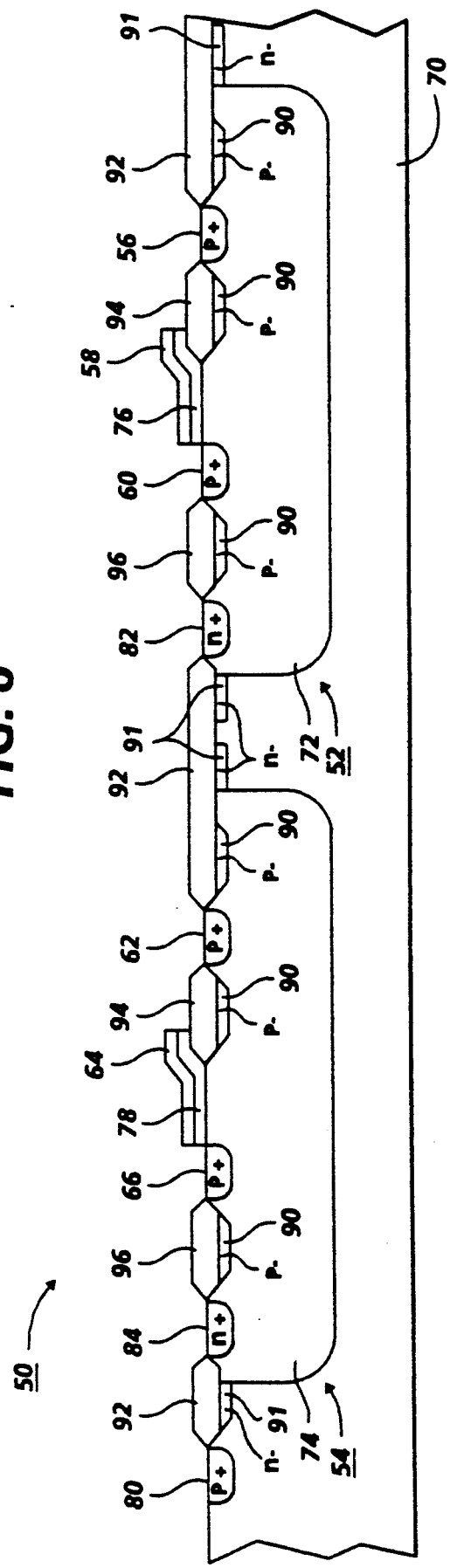
FIG. 6A shows the structure of the circuit of FIG. 4 utilizing two high voltage transistors with two n-well areas designed to handle high voltages.

Referring to FIG. 6, there is shown a structure of the circuit 50 (FIG. 4) utilizing two high voltage PMOS transistors. It should be noted that all of the process steps for deposition of materials, etching and patterning of the transistors shown in FIGS. 5, 6 and 6A are well known in the art. In FIG. 6, for the purpose of simplicity and in order to be able to refer to FIGS. 4 and 9, the two PMOS transistors, the source regions, the drain regions, the gates, the n-wells and the substrate are all given the same reference numbers used in the structure of the circuit 50 utilizing low voltage transistors (FIG. 5).

In the structure shown in FIG. 6, layers of field oxide 92 and 94 are located adjacent to the source regions 56 and 62. There is also a layer of field oxide 96 located between the drain 66 and the n+ region 84 and another layer of field oxide 96 located between drain 60 and the n+ region 82. P-type offset regions 90 are located under layers of field oxide 92, 94 and 96. The gates 58 and 64 are insulated from the n-wells 72 and 74 by two layers 76 and 78 of silicon dioxide respectively. The offset regions 90 have lower impurity concentration than the impurity concentration of the source regions 56 and 62 in order to have high resistance. The offset regions 90 redistribute the electric field density created due to the high voltage thus increasing the breakdown voltages of regions 56 and 62.

In operation of the embodiment of FIGS. 4, 5 and 6, when the input voltage $V_i$ is in the neighborhood of the ground potential, the PMOS transistors 52 and 54 are ON. When the PMOS transistors 52 and 54 are ON, the output voltage becomes approximately $+V_{SS}$. However, when the input voltage $V_i$ is at +5 V, the PMOS transistor 52 is OFF and therefore the output voltage drops to a voltage close to $-V_{DD}$.

Figure 7:
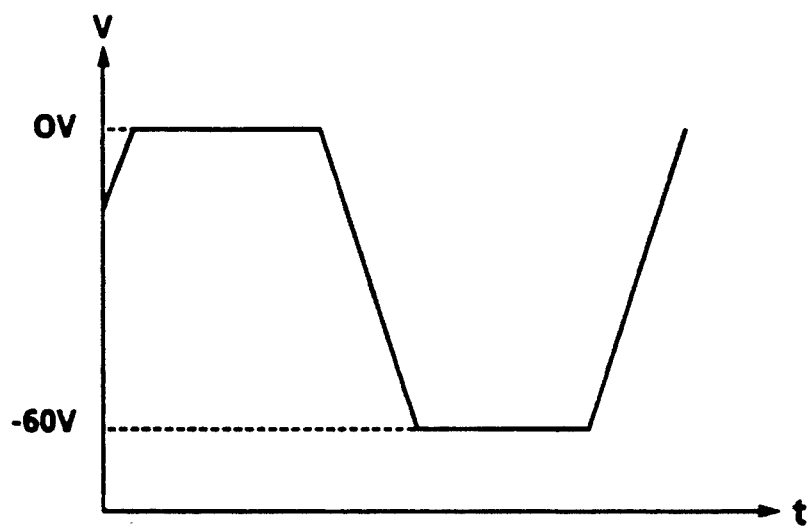
FIG. 7 shows a curve of a voltage swing of this invention which swings between a ground potential and a negative voltage.

When the n-wells 72 and 74 are grounded, the output $V_o$ swings between the ground potential and $-V_{DD}$ as long as the difference between ground and $-V_{DD}$ is not more than the breakdown voltage. For example, with high voltage transistors (FIG. 6), if the breakdown voltage is 60 V and $-V_{DD}$ is $-60$ V, then the output $V_o$ swings between 0 V and $-60$ V. Referring to FIG. 7, there is shown an example of a voltage swing between 0 and $-60$. The horizontal axis represents time and the vertical axis represents voltage. It should be noted that for a high breakdown voltage such as 60 V the structure of FIG. 6 will be used. However, if a low voltage swing is needed, the structure of FIG. 5 can provide a negative voltage swing in the range of its breakdown voltage.

Referring back to FIG. 4, circuit 50 of this invention is capable of not only generating negative voltage swings but also positive voltage swings. In FIGS. 5 and 6, when the n-wells 72 and 74 are connected to a positive potential such as the source voltage $+V_{SS}$ with respect to the grounded substrate 70, as long as the difference between $+V_{SS}$ and $-V_{DD}$ is less than the breakdown voltage, the output $V_o$ swings between $+V_{SS}$ and $-V_{DD}$. For example, with high voltage transistors (FIG. 6), if $+V_{SS}$ is $+5$ V and the breakdown voltage $V_{BR}$ is 60 V, then $-V_{DD}$ can not be more negative than $-55$ V and therefore the output voltage $V_o$ swings between $+5$ V and $-55$ V. It should be noted that in the structure of FIG. 6, the PMOS transistors 52 and 54 are high voltage transistors and they have a high breakdown voltage. However, the n-wells 72 and 74 are not designed to be connected to high voltages. Therefore, the n-wells 72 and 74 can handle a voltage in the range of 0 to $+5$ V. Circuit 50, with the structure of FIG. 6, has a negative voltage swing as low as $-60$ V and a positive voltage swing as high as $+5$ V. However, if a positive voltage swing with a higher voltage is desired, the n-wells 72 and 74 can be designed to handle higher voltages.

Referring to FIG. 6A, there is shown a preferred embodiment of a structure of the circuit 50 (FIG. 4) utilizing two high voltage PMOS transistors with two n-well areas 72 and 74 designed to handle high voltages. FIG. 6A is an improved version of the structure shown in FIG. 6. In FIG. 6A, the field oxide 92 of n-well 74 (adjacent to the source 62) is extended beyond the n-well 74 and into the n-well 72, the field oxide 92 of n-well 72 (adjacent to the source 56) is extended beyond the n-well 72 and finally there is another layer of field oxide 92 between the n+ region 84 and p+ region 80. N-type offset regions 91 are located under the layers of field oxide 92 in the substrate 70 and out side of the n-wells 72 and 74. The additional field oxide layers along with the n-type offset regions increase the voltage handling capability of the n-wells 72 and 74. Therefore, with the structure of FIG. 6A, the n-wells 72 and 74 can be connected to voltages as high as $+60$ V.

Figure 8:
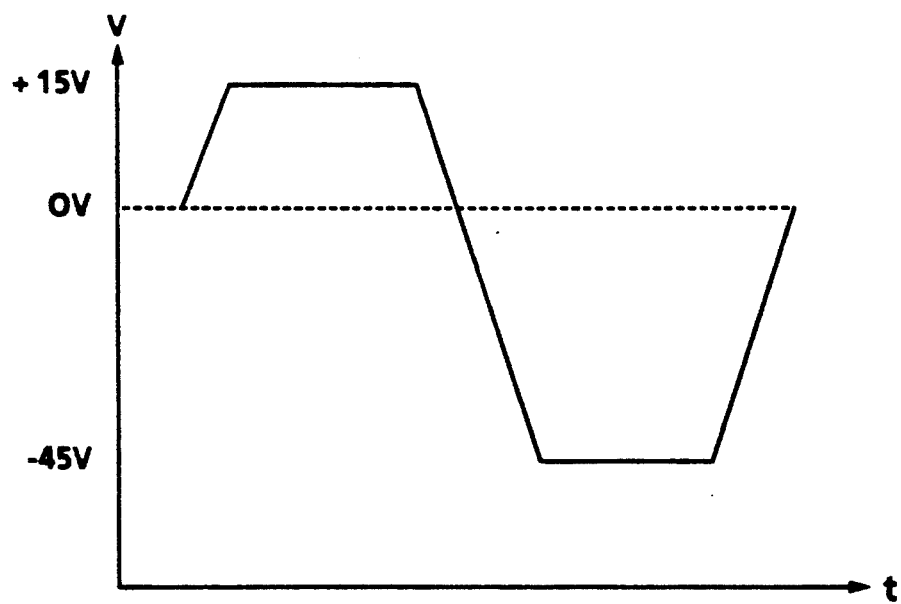
FIG. 8 shows a curve of a voltage swing of this invention which swings between a positive voltage and a negative voltage.

This capability allows the voltage swing of circuit 50 (FIG. 4) to have high positive voltages as well as high negative voltages. Therefore, a high voltage transistor with a high voltage n-well provides the possibility of connecting the n-well to voltages as high as $+60$ V and also provides the possibility of connecting the drain to high negative voltages such as $-60$ V. With these characteristics, different swings can be generated. For example, if the breakdown voltage is 60 V and if $+V_{SS}$ is $+15$ V, then $-V_{SS}$ should not be more negative than $-45$ V. In this arrangement, the output voltage $V_o$ swings between $+15$ V and $-45$ V. Referring to FIG. 8, there is shown an example of a voltage swing between $+15$ and $-45$. The horizontal axis represents time and the vertical axis represents voltage.

It should always be noted that the voltage difference between the high positive voltage (the n-well voltage) and the high negative voltage ($-V_{DD}$) should be kept below the break down voltage. For Example If the breakdown voltage is 60 V, and if the n-well is connected to $+50$ V or $+30$ V, then the drain can be connected to $-10$ V or $-30$ V respectively.

It should also be noted that any high voltage PMOS can replace the high voltage PMOS disclosed in this embodiment.

Figure 9:
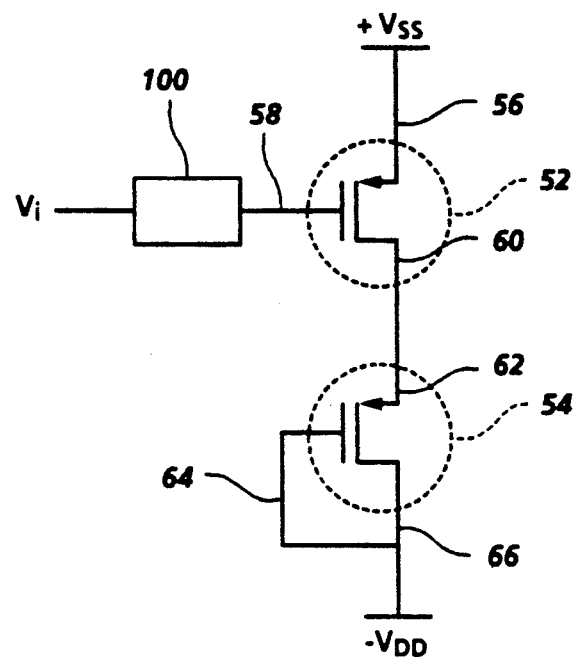
FIG. 9 shows the circuit diagram of FIG. 4 in conjunction with a level translator.
Figure 10:
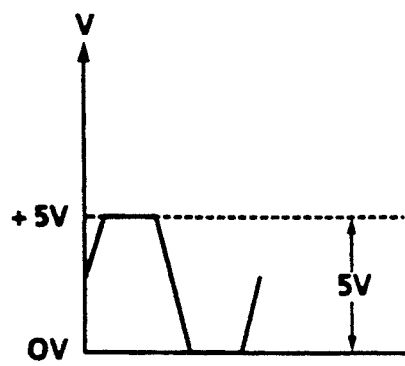
FIG. 10 shows a curve of an input voltage swing.
Figure 11:
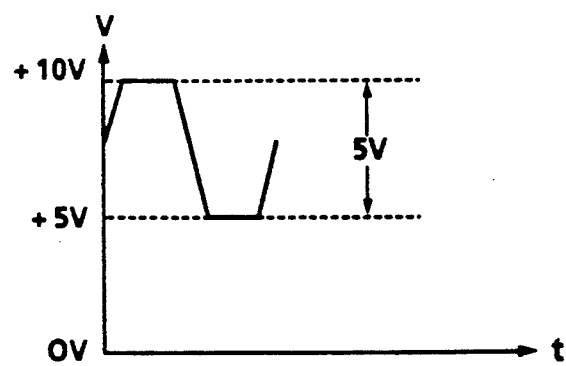
FIG. 11 shows a curve of the input voltage swing of FIG. 10 after it has been shifted.

Referring to FIG. 9, it should further be noted that if the source voltage $+V_{SS}$ is more than $+5$ V, a level translator 100 is needed to shift the input voltage $V_i$ from TTL (Transistor-Transistor Logic level (0 to $+5$ V) to a level which matches the $+V_{SS}$. Referring to FIG. 10, there is shown a voltage swing of a TTL input voltage $V_i$. The horizontal axis represents time and the vertical axis represents voltage. The input voltage $V_i$ swings between 0 V and $+5$ V and the swing range (the difference between the highest voltage and the lowest voltage) is 5 V. Referring to FIG. 11, there is shown an example of a shifted input voltage which matches a voltage source $+V_{SS}=+10$ V. The horizontal axis represents time and the vertical axis represents voltage. Referring back to FIG. 9, for example, if the source voltage $+V_{SS}=+10$ and if the input voltage $V_i$ is a TTL input, then the level translator 100 has to shift the input voltage $V_i$ from its TTL level in such a manner that the shifted input voltage swings between $+5$ V to $+10$ V (FIG. 11). In other words, the swing range is kept at 5 V, but the lowest voltage level and the highest voltage level of the input voltage are shifted to the new levels of $+5$ V and $+10$ V respectively.

Figure 12:
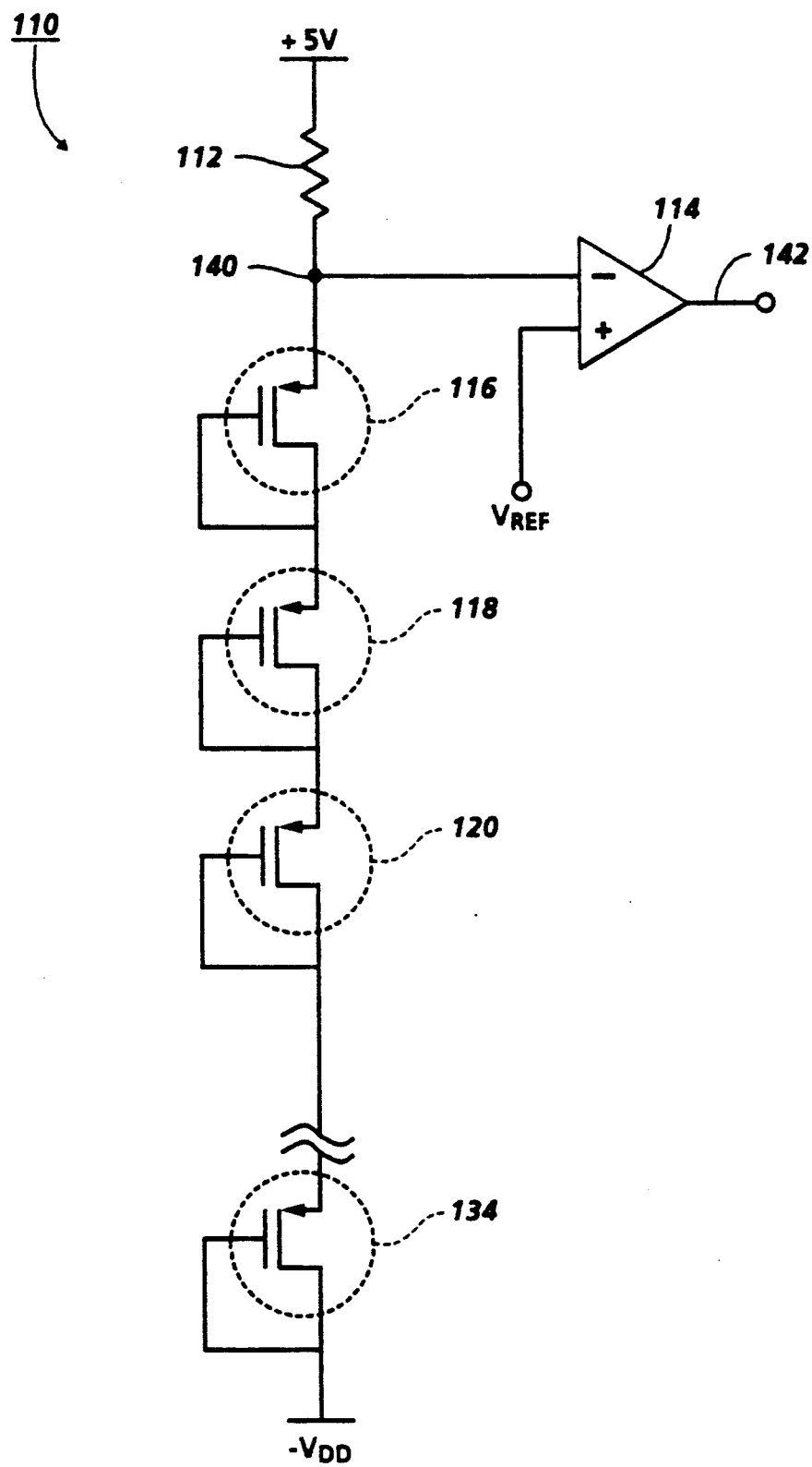
FIG. 12 shows a circuit diagram of a power normal application of this invention.

Referring to FIG. 12, there is disclosed a power normal circuit 110 which is another application of a PMOS transistor utilized to recognize a negative voltage level. The power normal circuit 110 consists of a resistor 112, an op-amp 114 and ten PMOS transistors which for the purpose of simplicity only four transistors 116, 118, 120 and 134 are shown. Each one of these ten transistors has a threshold voltage equal to $-1$ V. The PMOS transistors 116 through 134 have their gates connected to their drains. The drain of PMOS transistor 116 is connected to the source of the PMOS transistor 118 and the drain of PMOS transistor 118 is connected to the source of the PMOS transistor 120. In the same manner all the PMOS transistors which are not shown are connected to each other and the drain of the PMOS transistor 134 is connected to a negative voltage $-V_{DD}$. The source of PMOS transistor 116 is connected to node 140 and node 140 is connected to a positive voltage $+5$ V through the resistor 112. The node 140 is also connected to the inverting input of the op-amp 114. The non-inverting input of the op-amp 114 is connected to a reference voltage $V_{ref}$.

In operation, the circuit 110 functions as a sensor. Every time the negative voltage $-V_{DD}$ becomes more negative than $-5$ V, the output of the op-amp 114 sends out a signal. When the negative voltage $-V_{DD}$ is less negative than $-5$ V, the difference between the $+5$ V and $-V_{DD}$ is less than 10 volts. Since the threshold voltage of each transistor is $-1$ V and there are ten transistors, there should be at least 10 volts difference across node 140 and $-V_{DD}$ in order to turn on the transistors. Therefore, when the negative voltage $-V_{DD}$ is less negative than $-5$ V, the circuit is inactive and the node 140 is at $+5$ V.

Figure 13:
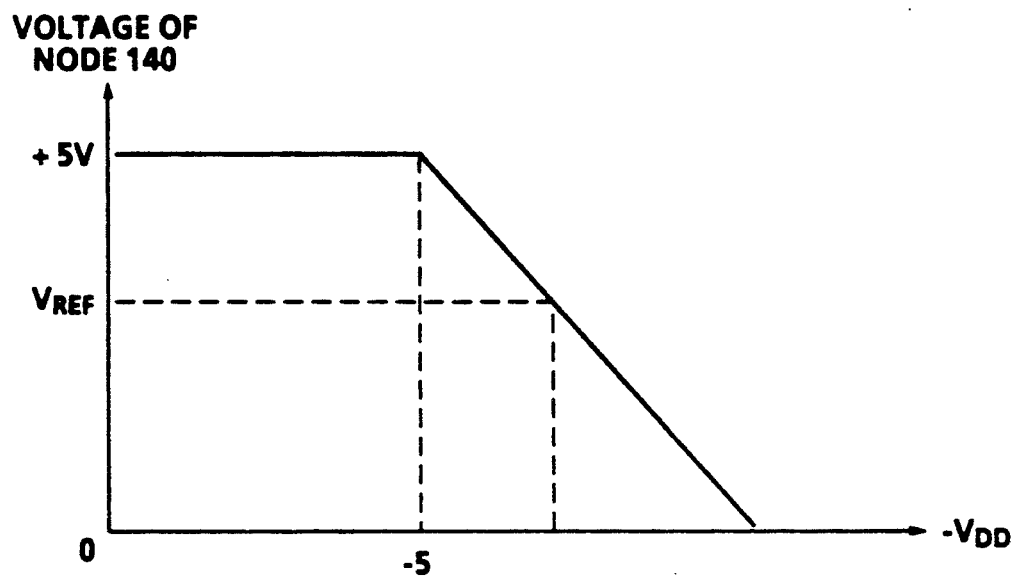
FIG. 13 shows a curve of the voltage of node 140 of FIG. 12.
Figure 14:
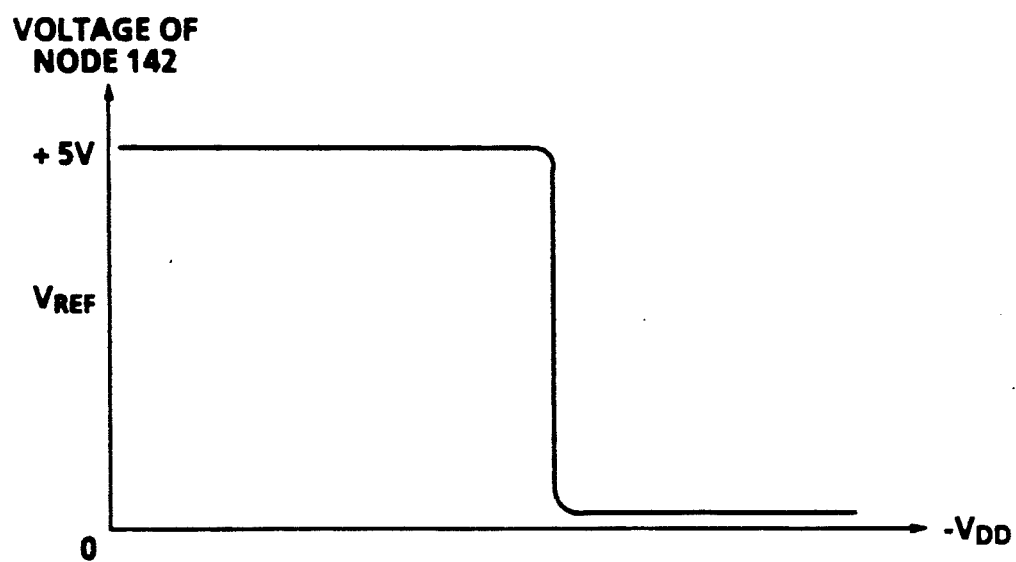
FIG. 14 shows a curve of the voltage of node 142 of FIG. 12.

However, when the negative voltage $-V_{DD}$ becomes more negative than $-5$ V, the transistors turn on and the voltage of node 140 starts dropping. As the negative voltage $-V_{DD}$ becomes more negative, the voltage of the node 140 drops more. Referring to FIG. 13, there is shown a curve of the voltage of the node 140 as a function of the negative voltage $-V_{DD}$. The horizontal axis represents the negative voltage $-V_{DD}$ and the vertical axis represents the voltage of node 140. As it can be observed, the voltage of node 140 stays at 5 V during the time the negative voltage $-V_{DD}$ is less negative than $-5$ V and it starts dropping as the negative voltage $-V_{DD}$ becomes more negative than $-5$ V. When the voltage of the node 140 drops to the level of the reference voltage ($V_{ref}$) of the op-amp, the output voltage of the op-amp 114 switches. Referring to FIG. 14, there is shown a curve of the output voltage of the op-amp 114 which corresponds to the curve shown in FIG. 13. The horizontal axis represents the negative voltage $-V_{DD}$ and the vertical axis represents the output voltage of op-amp which is shown by the voltage of node 142. Referring to both FIGS. 13 and 14, as it can be observed, when the dropping voltage of node 140 reaches the $V_{ref}$, the output voltage of the op-amp switches from +5 V to a voltage close to the ground potential.

Figure 15:
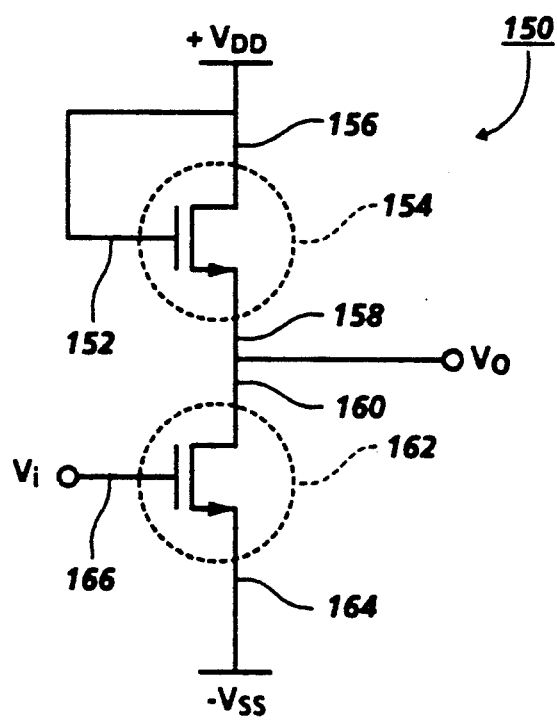
FIG. 15 shows an integrated circuit diagram of a RS232 driver of this invention utilizing two NMOS transistors.

It should be noted that the disclosed embodiment of the invention can be designed by utilizing NMOS transistors. Referring to FIG. 15, there is shown a circuit diagram 150 of a NMOS circuit which is capable of having positive and negative voltage swings. The gate 152 of a NMOS transistor 154 is connected to its drain 156 and the drain 156 is connected to a positive voltage $+V_{DD}$. The source 158 of the NMOS transistor 154 is connected to the drain 160 of a NMOS transistor 162. The source 164 of the transistor 162 is connected to a negative voltage $-V_{SS}$ and the gate 166 of the NMOS transistor 162 is connected to an input voltage $V_i$. The output voltage $V_o$ is the voltage of the source 158 of the NMOS transistor 154.

Figure 16:
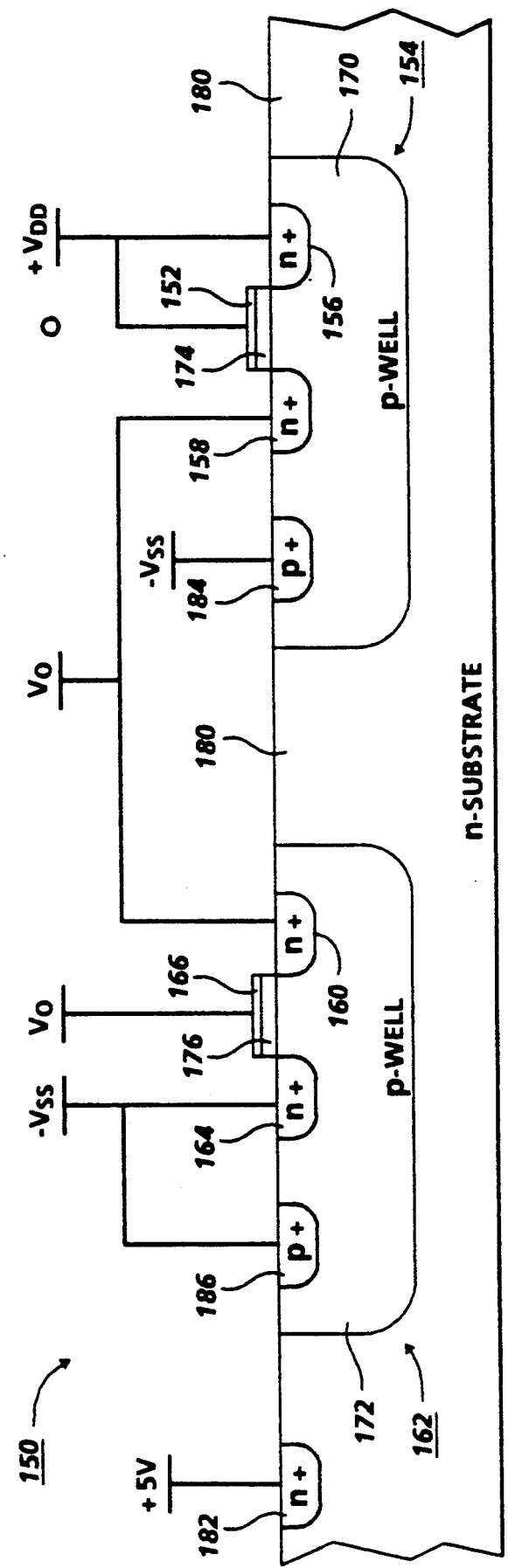
FIG. 16 shows the structure of the circuit of FIG. 15 utilizing two low voltage transistors.

Referring to FIG. 16, there is shown a structure of the circuit 150 of FIG. 15. For simplicity, the structure of the circuit 150 is shown with two low voltage NMOS transistor. The two n+ regions 156 and 158 of the NMOS transistor 154 and the two n+ regions 160 and 164 of the NMOS transistor 162 are diffused into p-wells 170 and 172 respectively to generate the sources 158 and 164 and the drains 156 and 160. Metal/poly gates 152 and 166 are insulated from the n-wells by two layers of silicon dioxide 174 and 176 respectively.

The n-type substrate 180 is connected to a positive voltage such as +5 V through the n+ region 182. It should be noted that the p-well 170 of NMOS transistor 154 and the p-well 172 of NMOS transistor 162 have to be connected to the same potential or both transistors 154 and 162 have to be in the same p-well. The p-well 170 and the p-well 172 are connected to a negative voltage through the p+ regions 184 and 186 respectively.

If the NMOS transistors 154 and 162 are designed to handle high voltages, then the drain 156 of the NMOS transistors 154 can be connected to positive voltages such as +60 V and the if the p-well of the transistors 154 and 162 are designed to handle high voltages, then the source 164 of the NMOS transistors 162 can be connected to negative voltages such as $-60$ V. However, it should always be noted that the difference between the positive voltage ($+V_{DD}$) and the negative voltage (the n-well voltage) should be kept below the breakdown voltage.

It should be understood that the principle of this invention can also be applied to other technologies such as silicon on insulator (SOI), silicon on Sapphire (SOS), Dielectric isolated CMOS (DI), Bipolar CMOS DMOS process (BCD), etc.

What is claimed is:

1. In a high voltage system comprising:
   an integrated device having a p-type substrate, a plurality of p-channel type metal oxide silicon field-effect transistors, a plurality of n-channel type metal oxide silicon field-effect transistors;
   said p-channel type metal oxide silicon field-effect transistors and said n-channel type metal oxide silicon field-effect transistors each having a source, a drain and a gate;
   at least one of said p-channel type metal oxide silicon field-effect transistors being an output transistor;
   said system including a ground potential, a voltage source above said ground potential and a voltage source below said ground potential;
   said substrate being connected to said ground potential; and
   said drain of at least one output transistor being connected to said voltage source below said ground potential and said source of said at least one of said output transistor being connected to said voltage source above said ground potential.

2. The integrated device recited in claim 1, wherein said at least one output transistor withstands an electro-static discharge shock independent of an electro-static discharge protection circuit.

3. In a high voltage system comprising:
   an integrated device having a n-type substrate, a plurality of n-channel type metal oxide silicon field-effect transistors, a plurality of p-channel type metal oxide silicon field-effect transistors;
   said n-channel type metal oxide silicon field-effect transistors, and said p-channel type metal oxide silicon field-effect transistors each having a source, a drain and a gate;
   at least one of said n-channel type metal oxide silicon field-effect transistors being an output transistor;
   said system including a positive voltage source, a voltage source above said positive voltage source and a voltage source below said positive voltage source;
   said substrate being connected to said positive voltage source; and
   said drain of at least one output transistor being connected to said voltage source above said positive voltage source and said source of said at least one of said output transistor being connected to said voltage source below said positive voltage source.

4. The integrated device recited in claim 3, wherein said at least one output transistor withstands an electro-static discharge shock independent of an electro-static discharge protection circuit.

* * * * *